(12) United States Patent
Bradfield et al.

(10) Patent No.: US 6,911,750 B2
(45) Date of Patent: Jun. 28, 2005

(54) ELECTRONIC PACKAGE FOR ELECTRICAL MACHINE

(75) Inventors: Michael D. Bradfield, Anderson, IN (US); David Maley, Anderson, IN (US); Michael McCord, Anderson, IN (US); Chris Bledsoe, Anderson, IN (US)

(73) Assignee: Delco Remy International, Inc., Anderson, IN (US)

( * ) Notice: Subject to any disclaimer, the term of this patent is extended or adjusted under 35 U.S.C. 154(b) by 0 days.

(21) Appl. No.: 10/702,029

(22) Filed: Nov. 4, 2003

(65) Prior Publication Data

US 2005/0001492 A1 Jan. 6, 2005

Related U.S. Application Data

(60) Provisional application No. 60/485,084, filed on Jul. 3, 2003.

(51) Int. Cl.$^7$ .............................................. H02K 11/00
(52) U.S. Cl. ........................ 310/68 D; 310/58; 310/64; 363/145
(58) Field of Search ................................ 310/68 D, 71, 310/58, 64; 383/145

(56) References Cited

U.S. PATENT DOCUMENTS

| | | | | |
|---|---|---|---|---|
| 4,606,000 A | * | 8/1986 | Steele et al. ................. | 363/145 |
| 5,451,823 A | * | 9/1995 | Deverall et al. .......... | 310/68 D |
| 5,453,648 A | * | 9/1995 | Bradfield ..................... | 310/71 |
| 5,682,070 A | * | 10/1997 | Adachi et al. ................ | 310/71 |
| 5,812,388 A | | 9/1998 | Keidar et al. ............... | 363/145 |
| 5,991,184 A | * | 11/1999 | Russell et al. .............. | 363/145 |
| 6,121,699 A | * | 9/2000 | Kashihara et al. ........ | 310/68 D |
| 6,205,024 B1 | | 3/2001 | Shih et al. ................... | 361/704 |
| 6,285,100 B1 | | 9/2001 | Pflueger et al. ........... | 310/68 D |
| 6,659,212 B2 | * | 12/2003 | Geisse et al. ............... | 180/65.2 |
| 6,707,691 B2 | * | 3/2004 | Bradfield ..................... | 363/145 |
| 6,731,030 B2 | * | 5/2004 | Keidar et al. ............. | 310/68 D |
| 6,731,031 B2 | * | 5/2004 | Sarkar et al. ............. | 310/68 D |

FOREIGN PATENT DOCUMENTS

| | | | | | |
|---|---|---|---|---|---|
| JP | 59056856 A | * | 4/1984 | .......... | H02K/19/36 |
| JP | 07303352 A | * | 11/1995 | ............ | H02K/9/28 |
| JP | 07336945 A | * | 12/1995 | ............ | H02K/9/06 |
| JP | 2001169610 A | * | 6/2001 | ............ | A01C/1/00 |

* cited by examiner

Primary Examiner—Joseph Waks
(74) Attorney, Agent, or Firm—Cantor Colburn LLP

(57) ABSTRACT

An electronic package for an electrical machine preferably a rotary current generator includes a slip ring end (SRE) frame defining one end of a housing configured for mounting a rotor therein so as to be rotatable; a plurality of negative diodes dispersed in an angular fashion in the SRE frame acting as a negative heat sink; a plurality of positive diodes mounted on a separate electrically conductive plate located above a location of the plurality of negative diodes, the plate being configured as a positive heat sink having corresponding holes such that leads extending from each negative diode protrude directly therethrough and openings formed in the positive heat sink to engage a body of each positive diode; and a non-conductive separator fitted over a series of bosses that space the positive heat sink above a top surface defining the negative heat sink, the separator configured to electrically insulate the positive heat sink and negative heat sink from one another, wherein waste heat from the positive and negative heats sinks is to be carried off via vents configured in each and radially outwardly across surfaces defining each.

24 Claims, 8 Drawing Sheets

ELECTRONIC PACKAGE FOR ELECTRICAL MACHINE

CROSS REFERENCE TO RELATED APPLICATION

This application claims the benefit of U.S. Provisional Application No. 60/485,084, filed Jul. 3, 2003 the contents of which are incorporated by reference herein in their entirety.

TECHNICAL FIELD

This application relates generally to an electrical apparatus. More specifically, this application relates to an electronic component package having a diode rectifier bridge, regulator, and brush holder assembly for an electrical machine and a method of manufacturing the same.

BACKGROUND

Electrical loads for vehicles continue to escalate. At the same time, the overall package size available for the electrical generator continues to shrink. Consequently there is a need for a higher power density system and method of generating on-board electricity.

The increase in the demand for current to be produced by an alternator leads to a need for corresponding adaptation of the system for current regulation, and particularly of a system whereby the three-phase alternating current produced by an alternator is rectified, into a direct current, which can be stored in a battery of a vehicle or be used directly by the electrical circuit of the vehicle which is supplied with a direct current (DC) voltage.

Rectification of the three-phase alternating current is generally obtained by means of a rectifier bridge having six power diodes. Three of these diodes are the positive diodes, and are connected between the phase terminals of the stator windings of the alternator and the positive terminal B+ of the alternator which is connected to the battery and the electrical circuit of the vehicle. Three further diodes, namely the negative diodes, are connected between electrical ground or earth of the vehicle and the aforementioned phase terminals of the stator windings.

The diodes constitute the rectifier bridge and are subjected to high current. Hence, it is necessary to cool them in the most effective way possible. To this end, it is known to arrange the diodes on metal plates, which are arranged on the outside of the alternator and which constitute a dissipator for the heat produced by the diodes. The diodes are grouped on two carrier plates, one of which is reserved for the positive diodes, and the other for the negative diodes.

The rectifier diodes are connected to respective carrier plates, and these carrier plates are used as heat sinks for these diodes as well. The rectifier diodes are inserted by pressure in receiving bore holes of the carrier plate or heat sink, or are soldered to the carrier plate using appropriate solder alloys. The end wires connected to the rectifier diodes enable the rectifier diodes to be connected to external sources.

However, under certain particularly severe operating conditions, it has become apparent that this cooling of the diodes, and in general terms the cooling of the whole of the current regulating means, can be insufficient to ensure long-term reliability of the alternator.

The heat sinks are typically constructed in the shape of a circle or crescent and are fastened in the same plane to the alternating current generator.

It is important that the bridge rectifiers must not only be able to withstand normal battery charging current, but must also be able to supply high electrical load currents demanded by the vehicle and do so at high, elevated ambient temperatures. These demanding situations may occur, for example, when the vehicle is stuck in stop and go traffic on a hot night. Under such conditions the electrical loads are high due to headlights, air-conditioning, engine cooling fan, brake lights and various other miscellaneous electrical loads. The underhood temperatures are also high due to the outside ambient air temperature and the stop and go driving schedule. Bridge rectifiers, as discussed, are limited in their ability to reliably function under such high current and high temperature conditions. In order for bridge rectifiers to handle these types of excessive currents and heat, it becomes necessary to utilize a bridge rectifier which has higher current handling capability. Due to the space limitations of the alternating current generator, it then becomes very difficult to provide such a bridge rectifier from a feasibility standpoint as well as at an economical cost.

Increasing the current capacity and heat dissipating characteristics of the bridge rectifier has included mounting of semiconductor diode chips onto first and second metallic heat sinks which are electrically insulated from each other by a thin sheet of electrical insulating material. The diode chips are then covered by a protective insulating coating after connection to the respective heat sink. One of the metallic heat sinks includes a finned area which is subjected to cooling air when the bridge rectifier is mounted to the generator. The heat sink with the plurality of fins includes twelve air passages. This type of bridge rectifier is shown in U.S. Pat. No. 4,606,000 to Steele et al., incorporated herein by reference.

With time and vibration the electrical integrity of the electronic circuitry can fail due to fatigue from mechanical stress. This produces a loss of electrical output from the machine. Further, several parts are required to provide the output connection and therefore the piece or part cost and assembly cost is high.

There is a need to improve the performance characteristics of prior art bridge rectifiers. In addition, there is a need for a carrier plate which increases the dissipation of heat from the diode and more efficiently cool the diode by facilitating increased surface area of the heat sink available to a diode resulting in an increased rate of dissipation of heat from the diode through the carrier plate in which the diode is disposed. Furthermore, a more robust package assembly capable of withstanding vibration while providing an effective thermal dissipation that is also cost effective is accordingly desired.

BRIEF SUMMARY OF THE INVENTION

The above discussed and other drawbacks and deficiencies are overcome or alleviated by an electronic package for an electrical machine preferably a rotary current generator includes a slip ring end (SRE) frame defining one end of a housing configured for mounting a rotor therein so as to be rotatable; a plurality of negative diodes dispersed in an angular fashion in the SRE frame acting as a negative heat sink; a plurality of positive diodes mounted on a separate electrically conductive plate located above a location of the plurality of negative diodes, the plate being configured as a positive heat sink having corresponding holes such that leads extending from each negative diode protrude directly therethrough and openings formed in the positive heat sink to engage a body of each positive diode; a non-conductive separator fitted over a series of bosses that space the positive heat sink above a top surface defining the negative heat sink, the separator configured to electrically insulate the positive heat sink and negative heat sink from one another; a terminal assembly configured to make appropriate electrical connections between the positive and negative diodes, stator phase leads, and a regulator assembly; and the regulator assembly is operably fastened to the SRE frame at a plurality of locations, the regulator assembly electrically connects to the positive heat sink, a stator phase terminal extending from the terminal assembly, SRE frame, and a brush holder assembly; wherein waste heat from the positive and negative heats sinks is to be carried off via vents configured in each and radially outwardly across surfaces defining each.

In another embodiment, an output connection for an electrical machine, preferably a rotary current generator is disclosed. The output connection includes a B+ stud defined by a head at one end and threaded on the other end, the B+ stud protrudes through a positive heat sink anchored by the head resting against a surface defining the heat sink; a metallic spacer disposed over the B+ stud such that when an external battery cable is operably attached to the B+ stud, the B+ stud is in tension and the spacer is in compression when an external nut is fastened on the B+ stud; and knurling on at least one of the B+ stud and an inside diameter surface of the spacer such that when the metallic spacer is disposed on the B+ stud, the stud and spacer are in press-fit engagement.

DESCRIPTION OF THE PREFERRED EMBODIMENT

Referring to the Figures, an exemplary embodiment of a rectifier assembly 100 having six diodes for converting alternating current (AC) produced by an alternator into direct current (DC) for use in a vehicle is shown. An electronic package layout for an automotive vehicle alternator is generally described. The electronic package includes rectifier assembly 100, regulator assembly 19, and a brush holder 21.

Figure 1:
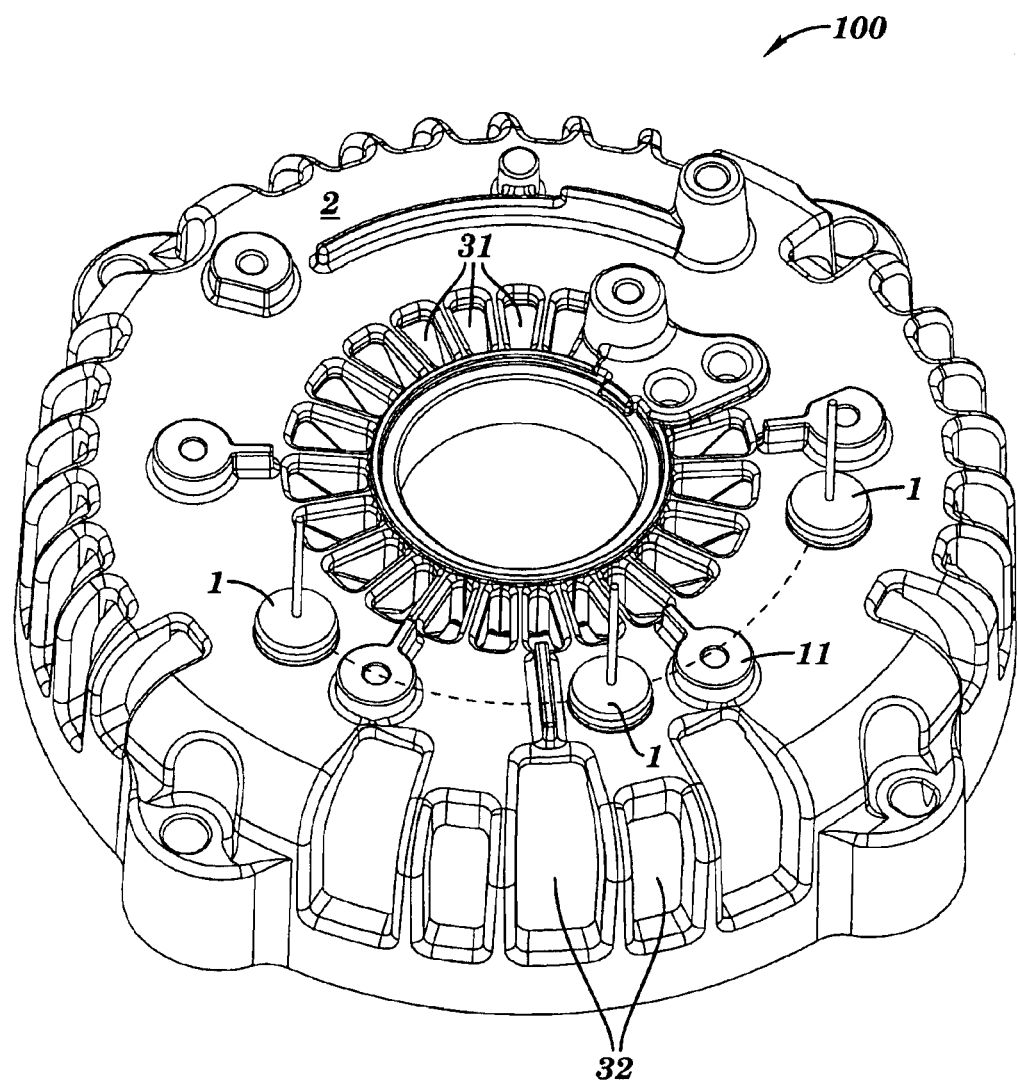
FIG. 1 is a perspective view of a slip ring end (SRE) frame of an alternator having three negative diodes disposed therewith of an exemplary embodiment of a bridge rectifier.

Referring now to FIG. 1, a perspective view of an exemplary embodiment of a bridge rectifier 100 is illustrated. Rectifier 100 includes a slip ring end (SRE) frame 2 of an alternator (not shown) having three negative diodes 1 disposed therewith. SRE frame 2 is preferably cast aluminum, but other materials are contemplated. The three negative diodes 1 are mounted directly in contact with the SRE frame 2 of the alternator. Diodes 1 are dispersed in an angular fashion and spaced from each other in a complementary configured aperture preferably allowing press-fit assembly. SRE frame 2 is configured as a structural, electrically and thermally conductive element (e.g., a negative heat sink) of the rectifier assembly 100. A plurality of vents 31 and 32 are concentrically disposed radially inward and outward, respectively, of diodes 1 forming an arc (shown in phantom) between diodes 1.

Figure 3:
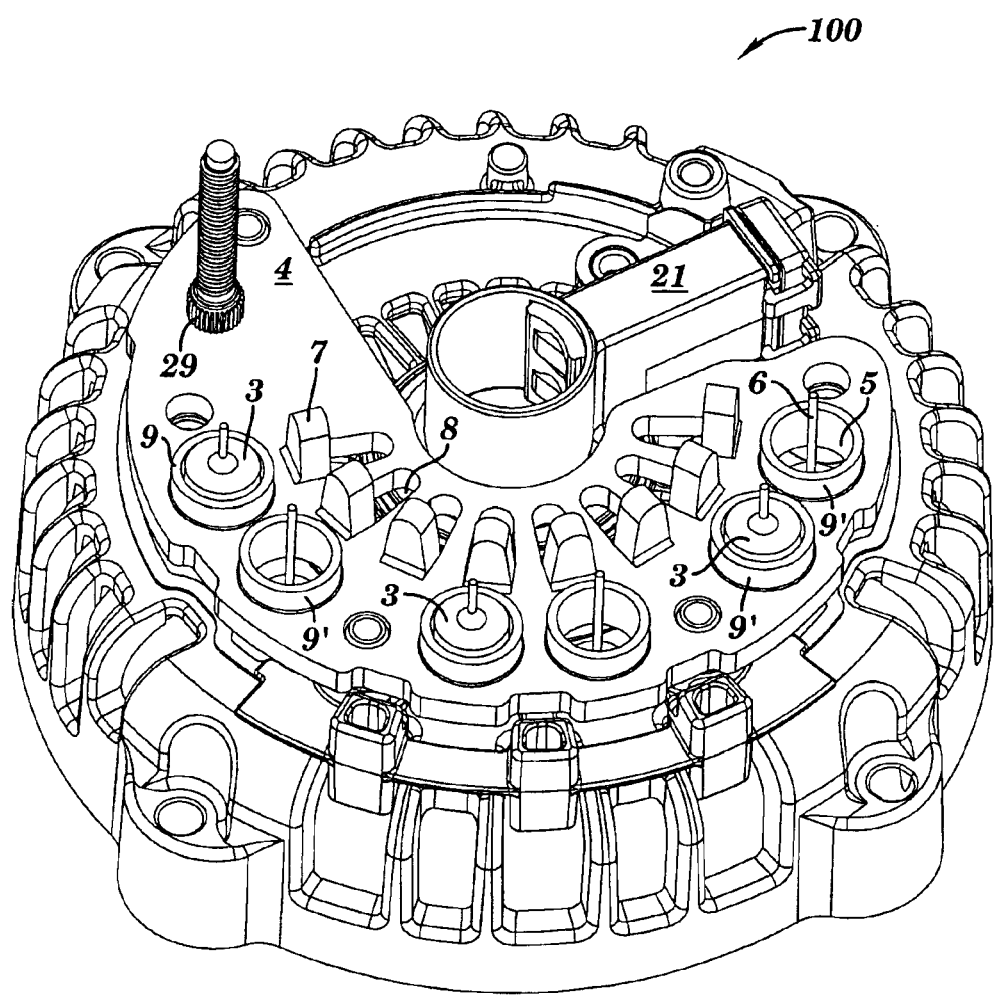
FIG. 3 is a perspective view of the bridge rectifier of FIG. 2 showing an electrically conductive plate (e.g., positive heat sink) having three positive diodes disposed therewith over the non-conductive separator.
Figure 4:
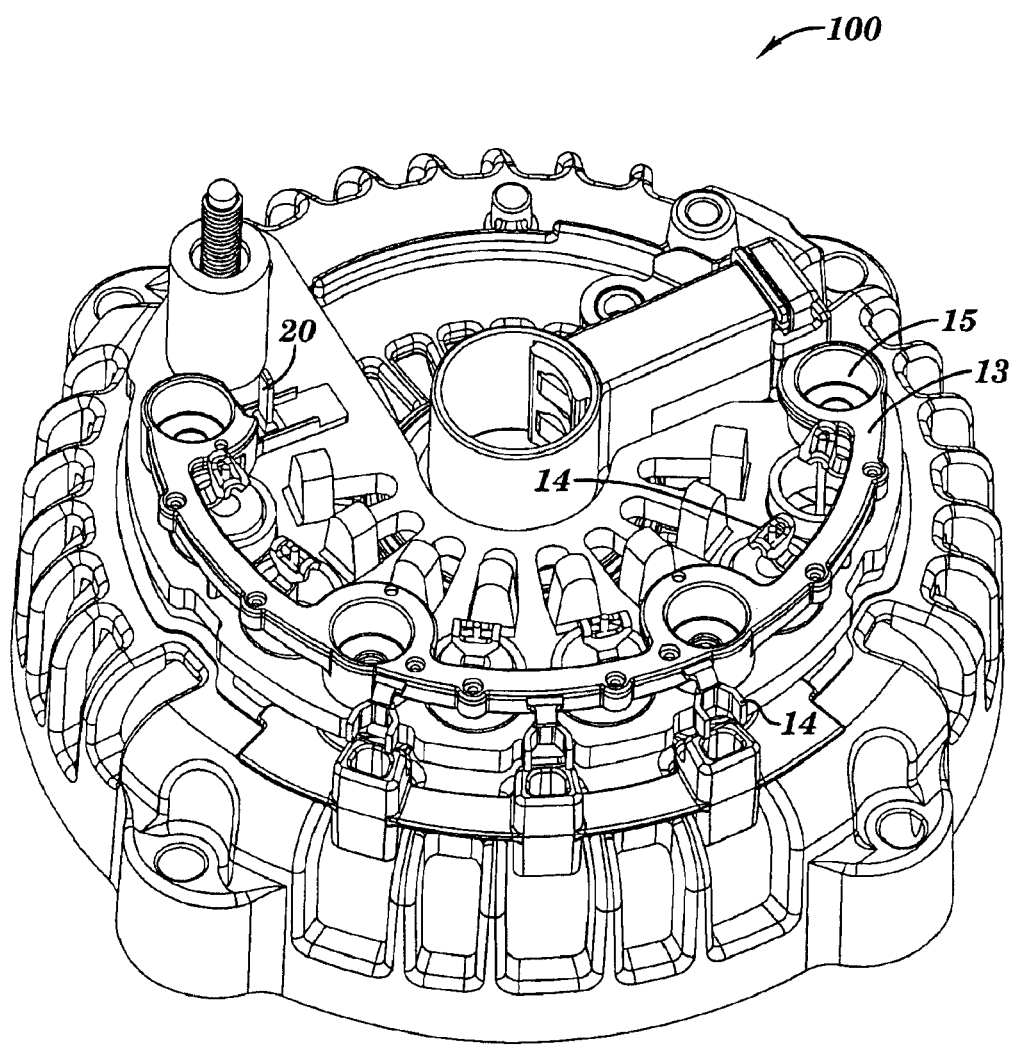
FIG. 4 is a perspective view of the bridge rectifier of FIG. 3 having a terminal assembly disposed over the positive heat sink.

Three positive diodes 3 are mounted on a separate electrically conductive plate 4 that is located directly above a location of the three negative diodes as illustrated in FIG. 3. Plate 4 is preferably configured as a positive heat sink having corresponding holes 5, such that leads 6 extending from the negative diodes 1 protrude directly through a corresponding hole 5 and are properly positioned with respect to a terminal assembly 13 for electrical connection therewith (as best seen in FIG. 4). Plate 4 is configured with a plurality of fins 7 extending therefrom and radial slots 8 formed in the positive heat sink for cooling. In an exemplary embodiment as illustrated, radial slots 8 are formed when fins 7 are punched out of plate 4 such that each fin 7 corresponds to a slot 8 aligned therewith. An opening 9 is formed in the positive heat sink 4 for disposal of a respective positive diode. In an exemplary embodiment, opening 9 is configured as a cylindrical wall 9 formed in the positive heat sink or plate 4 surrounding each positive diode 3. Cylindrical wall 9 is preferably configured to allow press-fit assembly of a corresponding positive diode 3 therein. Cylindrical wall 9 increases the surface area of contact with diode 3 to increase heat conduction from diode 3 and increase heat dissipation from cylindrical wall 9. Plate 4 is preferably made of aluminum, and more preferably with 1100 aluminum alloy, however, other suitable conductive materials are also contemplated. Moreover, although a cylindrical wall 9 has been described above, cylindrical wall 9 is not limited thereto, and includes other geometrical shapes as well, including, but not limited to, an octagon or star shape, for example.

Figure 2:
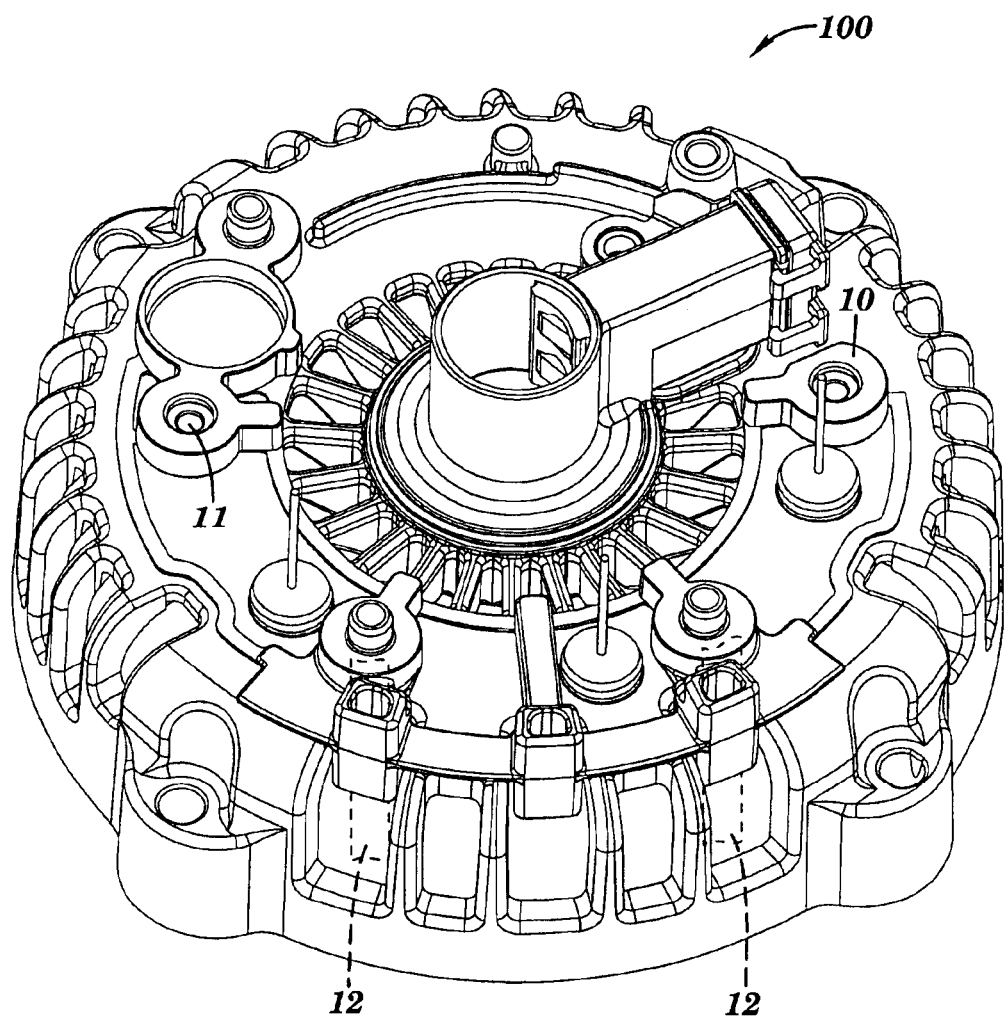
FIG. 2 is a perspective view showing a non-conductive separator disposed on the SRE frame of FIG. 1.

Referring now to FIG. 2, to electrically isolate the positive heat sink 4 from the SRE frame 2 that is at ground potential, a non-conductive separator 10 is fitted over a series of bosses 11 that space the positive heat sink 4 above a top surface defining SRE frame 2. Separator 10 is configured as a phase lead insulator 12 for the stator (not shown) to insulate the stator wires (three shown in phantom) that protrude through the SRE frame 2 which is at ground potential.

Referring now to FIG. 4, the appropriate electrical connections between the diodes 1 and 3, stator phase leads (shown in phantom), and a regulator 19 (FIGS. 5–8) are made through the use of terminal assembly 13. The terminal assembly 13 is preferably configured in a circular arc fashion to match up with the curvature of the pattern of the disposed diodes 1, 3 and the configuration of positive heat sink 4. A single-piece electrical conductor 14 is preferably insert molded into terminal assembly 13. Electrical conductor 14 is preferably copper, but other suitably conductive materials may be employed. After insert molding terminal assembly 13, it is stamped to separate conductor 14 into appropriate sections for electrical connections with diodes 1 and 3, as well as the stator wires. Terminal assembly 13, positive heat sink 4, separator 10, SRE frame 2 is clamped via fasteners (not shown) that pilot through cylindrical walls 15 configured in terminal assembly 13 (four shown) securing the resulting assembly. Each of the cylindrical walls 15 provides electrical isolation for a corresponding fastener extending therethrough from the positive heat sink while acting as a boss structure for a corresponding cylinder wall 9' not having a diode 3 extending therethrough. Each of the fasteners are directly engaged with the SRE frame 2, such as for example, threaded engagement where the fastener is preferably a mechanical faster such as a threaded screw, for example.

Figure 5:
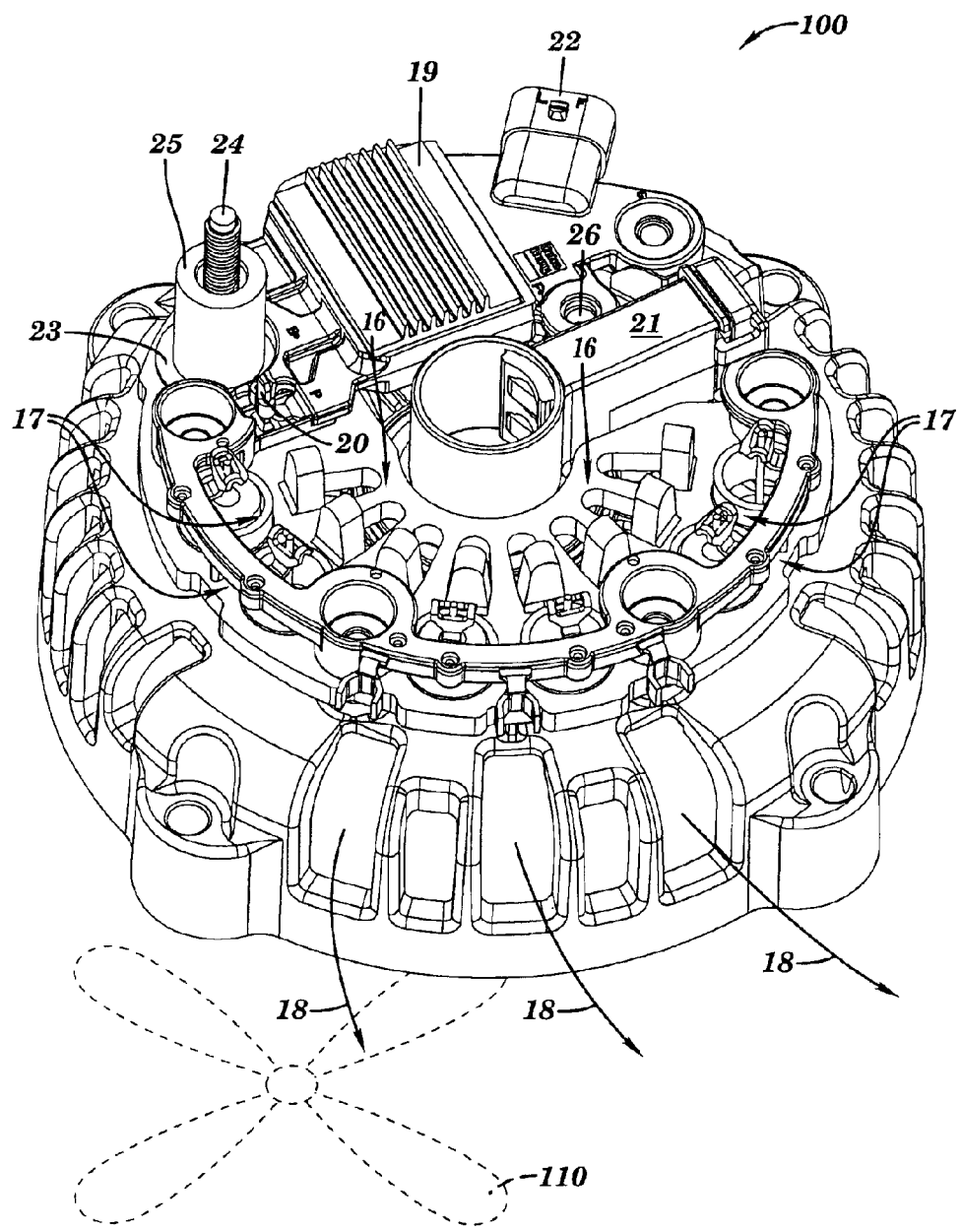
FIG. 5 is a perspective view of a regulator assembly disposed on the SRE frame and a fan disposed below the SRE frame in accordance with the exemplary embodiment of FIG. 4.

Referring now to FIG. 5, the rectifier assembly 100 is preferably cooled by multiple streams of air that flow across the positive heat sink 4 and negative heat sink or frame 2 and through various air passages configured therein. Due to the positive heat sink 4 being spaced from the SRE frame 2, air flows not only axially down through slots 8 proximate the finned area defined by fins 7 on the positive heat sink 4 generally indicated with arrows 16, but also flows radially across both faces defining frame 2 and plate 4 before entering the SRE frame 2 inlet generally indicated with arrows 17. The SRE frame 2 is also cooled by this radial movement of air but then also by the radial movement of air within the frame 2 as the air flows through the SRE frame 2 and across an inside face of SRE frame 2 before exiting in a radial fashion indicated generally with arrows 18. A fan 110 depicted generally with phantom lines is preferably employed to increase airflow at the slip ring end of the alternator. However, a fan could also be located on the drive end side of the rotor or even externally on the machine to create this air movement. Fan 110 is preferably configured to draw air into SRE frame 2 toward the electronic package residing therein. Fan 110 is operably connected to the shaft of the alternator, which preferably employs two fans 110 at either end.

Figure 6:
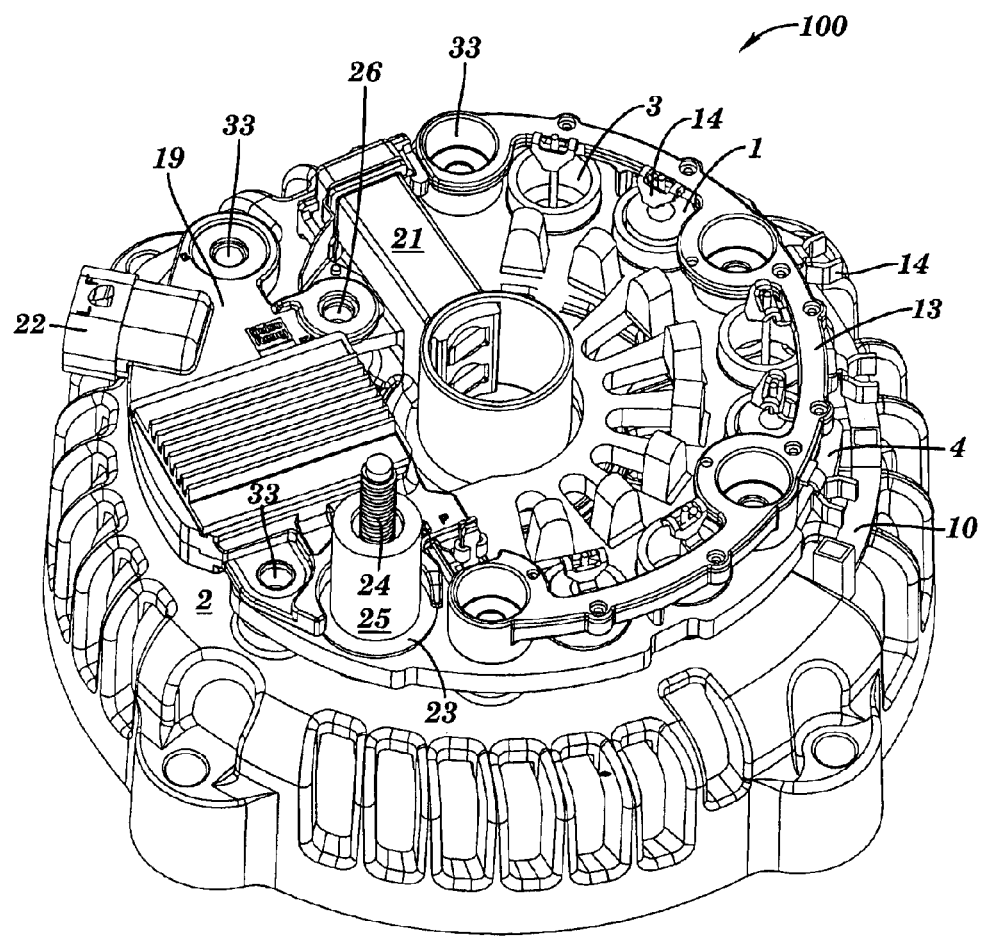
FIG. 6 is a perspective view of FIG. 5 without the fan and the SRE frame turned 90 degrees.
Figure 7:
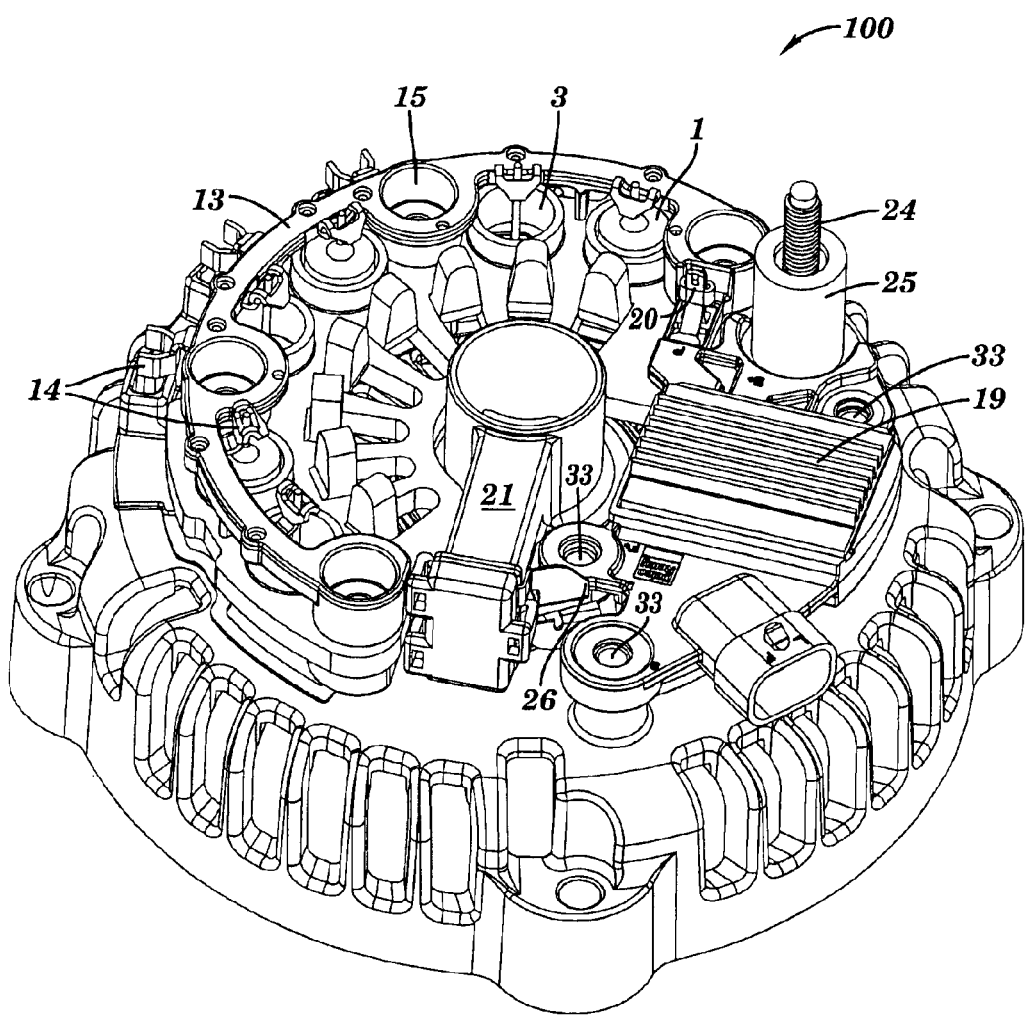
FIG. 7 is a perspective view of FIG. 6 showing the SRE frame turned another 90 degrees.

The regulator assembly 19 electrically connects to positive heat sink 4, a stator phase terminal 20 extending from terminal assembly 13, SRE frame 2 and a brush holder assembly 21. Regulator 19 includes a suitable connector assembly 22 disposed at one end that allows an external connector body to plug into regulator 19 for proper vehicle electrical interfacing. The regulator assembly 19 is preferably an enclosed package that is operably fastened to the SRE frame 2 at several locations, as best seen with respect to FIGS. 6 and 7 and generally indicated at 33. The regulator assembly 19 is electrically and structurally connected to the positive heat sink 4 that is at a battery B+ voltage potential by placing a ring terminal 23 formed in a lead frame of the regulator 19 over a B+ output stud 24 of the rectifier. The B+ stud 24 is pressed into a backside of the positive heat sink 4. A metallic spacer 25 is then pressed over the B+ stud on top of the regulator ring terminal 23. When the customer attaches an external battery cable 40 to the B+ stud 24, rectifier assembly 100 as a whole is placed in compression from the tension developed in the B+ stud 24 when an external nut 42 (see FIG. 8) is threadably fastened on stud 24. The regulator 19 is electrically connected to one of the stator phase windings via the terminal assembly 13 and a soldered connection at terminal 20. The electrical connection to the field positive (F+) terminal of a brush holder 26 of the brush holder assembly 21 is accomplished via a fastener (not shown) that clamps the regulator 19 to the brush holder 26 and is secured into the SRE frame 2 corresponding to one of the locations 33, as best seen in FIGS. 6 and 7. The field negative (F−) electrical connection for the brush holder is also made via this same clamped joint assembly.

In an exemplary embodiment with reference to FIGS. 3–6, the B+ stud 24 protrudes through the bottom of the positive heat sink 4 and is anchored by a head (not shown) that rests against the bottom surface defining the positive heat sink 4 and it threaded on the other end. Metallic spacer 25 is disposed over the B+ stud 24 such that when an external battery cable 40 is operably attached to the B+ stud 24, the B+ stud 24 is in tension and spacer 25 is in compression when an external nut 42 is fastened on the B+ stud 24 (see FIG. 8). FIG. 3 illustrates knurling 29 on the B+ stud 24 such that when the metallic spacer 25 is placed on the stud 24, the two parts are held together via a press-fit between the knurling 29 on the B+ stud 29 and the inside diameter surface defining spacer 25. In such an arrangement, one spacer 25 is utilized for multiple output studs such as M6 or M, as different customers require different B+ studs". This reduces the number of parts, assembly errors, and reduces costs. Further, use of tape that is commonly applied to the B+ stud to hold the spacer in location during assembly and shipping to the customer is eliminated.

Figure 8:
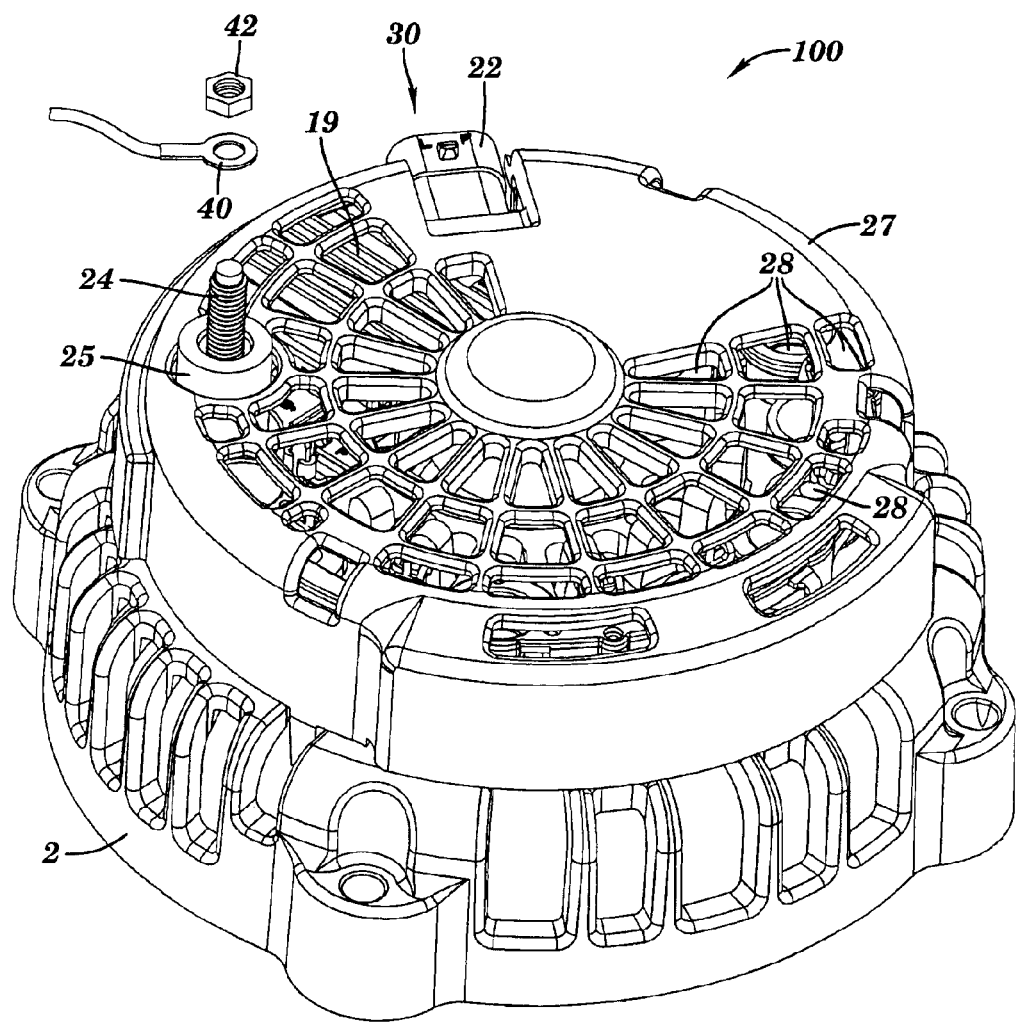
FIG. 8 is a perspective view of a cover disposed over the electronic package of the bridge rectifier in accordance with the exemplary embodiment of FIG. 5.

Referring now to FIG. 8, the entire electronic package described with respect to FIGS. 5–7 is shielded by a cover 27 that extends across the entire electronic package and attaches to the SRE frame 2. Cover 27 includes a plurality of vents 28 configured in a top surface defining cover 27 to allow airflow therethrough to the electronic package disposed below the top surface. Cover 27 is further configured having a cut away section generally indicated at 30 to allow connector assembly 22 therethrough for electrical connection with an external connector body. The top surface of cover 27 is also configured having an aperture to allow spacer 25 and B+ stud 24 to extend therethrough for electrical connection with a vehicle battery as discussed above.

The above described invention provides a geometrical layout of the various components that yields a very effective thermal package for the rectifier and a structural design of the assembled components produces a very robust assembly resistant to the effects of vibration.

Thermal aspects of an exemplary embodiment of the rectifier assembly described above include suitable angular spacing between the diodes. The negative diodes are mounted in or on the SRE frame allowing a dual air flow stream across and through the positive heat sink. The positive heat sink is configured with shear formed fins and concentric walls around the positive diodes that both yield high surface area for heat dissipation therefrom, where the SRE fan scrubs air directly across the face of the SRE frame for cooling.

The structural aspects of this exemplary embodiment of the rectifier assembly described above include the spacing of fasteners through insulated cylindrical walls every two diode pairs, formed concentric walls in the positive heat sink that increase plate stiffness as well as retaining a positive diode, fasteners that straddle the B+ output stud to compressingly assemble the rectifier assembly, and a rigid terminal assembly design and securing system.

Other aspects of an exemplary embodiment of the rectifier assembly described above include a B+ stud and spacer design interface using press-fit configurations, a phase lead insulator integrated into the positive heat sink separator, separator and terminal design with alternating up/down configuration for ease of location during assembly, and the regulator layout geometry.

Thermal packaging that may surpass the cooling efficiency of the above described rectifier assembly is liquid cooling, but such liquid cooling is cost prohibitive. From a vibration standpoint, the above described electronic package is more resistant to failure due to vibration than any other package design tested by the applicants. Furthermore, an exemplary embodiment of the above described electronic package of a rectifier assembly offers a significant thermal and structural advantage in a cost effective design.

The electrical current through a diode creates heat. The heat affects negatively the current capability of a diode. Thus, temperature/current capability are in opposite relation. Over a given temperature a diode is destroyed. Therefore on an alternator which generates high current, it is most necessary to cool the diodes by heat sinks and improve the heat dissipation of the heat sinks by increasing the surface area and flowing air over/through them.

The exemplary embodiments disclosed herein provide an improved bridge rectifier for an alternating current generator including a heat sink device having formed concentric walls around the positive diodes to increase a rate of heat dissipation relative to an absence of the formed concentric walls. Furthermore, the formed concentric walls increase stiffness of the heat sink device to withstand vibration.

While the invention has been described with reference to an exemplary embodiment, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the claims.

What is claimed is:

1. An electronic package for an electrical machine preferably a rotary current generator, comprising:
    a slip ring end (SRE) frame defining one end of a housing configured for mounting a rotor therein so as to be rotatable;
    a plurality of negative diodes dispersed in an angular fashion in the SRE frame acting as a negative heat sink;
    a plurality of positive diodes mounted on a separate electrically conductive plate located above a location of the plurality of negative diodes, the plate being configured as a positive heat sink having corresponding holes such that leads extending from each negative diode protrude directly therethrough and openings formed in the positive heat sink to engage a body of each positive diode;
    a non-conductive separator fitted over a series of bosses that space the positive heat sink above a top surface defining the negative heat sink, the separator configured to electrically insulate the positive heat sink and negative heat sink from one another;
    a terminal assembly configured to make appropriate electrical connections between the positive and negative diodes, stator phase leads, and a regulator assembly; and
    the regulator assembly is operably fastened to the SRE frame at a plurality of locations, the regulator assembly electrically connects to the positive heat sink, a stator phase terminal extending from the terminal assembly, SRE frame, and a brush holder assembly;
    wherein waste heat from the positive and negative heat sinks is convectively carried off through vents configured in each of the positive and negative heats sinks and radially outwardly across both surfaces defining each of the positive and negative heat sinks.

2. The package of claim 1, wherein the openings in the positive heat sink are elongated cylinder walls.

3. The package of claim 1, further comprising a cover that extends across to shield the electronic package, the cover attaches to the SRE frame.

4. The package of claim 1, wherein a plurality of vents are concentrically disposed radially inward and outward of the plurality of negative diodes forming an arc therebetween.

5. The package of claim 4, wherein radial slots are formed in the positive heat sink, the radial slots being substantially aligned with the plurality of vents disposed radially inward of the plurality of negative diodes.

6. The package of claim 5, wherein the radial slots are formed when fins are punched out of the plate defining the positive heat sink such that each fin corresponds to a slot aligned therewith.

7. The package of claim 6, wherein the positive heat sink being spaced from the SRE frame allows air to flow axially down through the slots proximate a finned area defined by the fins on the positive heat sink and also allowing flow radially across both faces defining the SRE frame and the plate before entering an SRE frame inlet defined by corresponding vents.

8. The package of claim 7, wherein the fan is disposed proximate a slip ring end of the machine and configured to draw air into the SRE frame toward the electronic package residing thereon.

9. The package of claim 8, wherein the fan scrubs air directly across the face of the SRE frame for cooling thereof.

10. The package of claim 1, wherein said corresponding holes having corresponding leads from the negative diodes extending therethrough protrude directly through the corresponding holes and are each aligned with a respective conductor extending from the terminal assembly for electrical connection therewith.

11. The package of claim 1, wherein each opening is preferably configured to at least one of allow press-fit assembly of a corresponding positive diode therein and increase a surface area of contact with the corresponding diode to increase heat conduction therefrom.

12. The package of claim 1, the separator is configured as a phase lead insulator insulating stator wires extending through the SRE frame 2 which is at ground potential and electrically connected to a corresponding conductor extending from the terminal assembly.

13. The package of claim 1, wherein the terminal assembly is preferably configured as an arc substantially matching a pattern of at least one the disposed plurality of negative diodes, plurality of positive diodes and configuration of the positive heat sink.

14. The package of claim 13, wherein the terminal assembly, positive heat sink, separator, and SRE frame are clamped together via fasteners that pilot through cylindrical walls configured in the terminal assembly securing the resulting assembly.

15. The package of claim 14, wherein each of the cylindrical walls provides electrical isolation from the positive heat sink for a corresponding fastener extending therethrough.

16. The package of claim 14, wherein the spacing of each fastener includes two diodes therebetween.

17. The package of claim 1, wherein a positive battery (B+) stud is operably connected to the positive heat sink.

18. The package of claim 17, wherein the regulator assembly is electrically and structurally connected to the positive heat sink that is at a B+ voltage potential by placing a ring terminal formed in a lead frame defining the regulator assembly over the B+ stud.

19. The package of claim 18, wherein a metallic spacer is disposed over the B+ stud on top of the regulator ring terminal such that when an external battery cable is operably attached to the B+ stud, the rectifier assembly is in compression from tension developed in the B+ stud when an external nut is fastened on the B+ stud.

20. The package of claim 1, wherein the regulator assembly is electrically connected to one of the stator phase windings via the terminal assembly.

21. The package of claim 20, wherein the terminal assembly includes a first conductor electrically connected to the one of the stator phase windings via a corresponding lead and a second conductor having a soldered connection between a tab extending from the terminal assembly and a corresponding receptacle of the regulator assembly.

22. The package of claim 1, wherein the positive heat sink is configured with shear formed fins and concentric walls around the positive diodes that both yield high surface area for heat dissipation therefrom, each of the formed concentric walls is configured to at least one of increase plate stiffness and retain a positive diode.

23. The package of claim 1, further comprising:

a B+ stud defined by a head at one end and threaded on the other end, the B+ stud protrudes through the positive heat sink anchored by the head resting against a surface defining the positive heat sink;

a metallic spacer disposed over the B+ stud such that when an external battery cable is operably attached to the B+ stud, the B+ stud is in tension and the spacer is in compression when an external nut is fastened on the B+ stud; and knurling on at least one of the B+ stud and an inside diameter surface of the spacer such that when the metallic spacer is disposed on the B+ stud, the stud and spacer are in press-fit engagement.

24. The package of claim 23, wherein the regulator assembly is electrically and structurally connected to the positive heat sink that is at a B+ voltage potential by placing a ring terminal formed in a lead frame defining the regulator assembly over the B+ stud.

* * * * *